United States Patent [19]
Nakamura et al.

[11] Patent Number: 5,853,532
[45] Date of Patent: Dec. 29, 1998

[54] WAFER RING SUPPLY AND RETURN DEVICE

[75] Inventors: Osamu Nakamura, Kokubunji; Shigeru Ichikawa, Higashiyamato; Tsuneharu Arai, Fussa, all of Japan

[73] Assignee: Kabushiki Kaisha Shinkawa, Tokyo, Japan

[21] Appl. No.: 698,666

[22] Filed: Aug. 16, 1996

[30] Foreign Application Priority Data

Aug. 18, 1995 [JP] Japan ..................................... 7-232108

[51] Int. Cl.[6] ..................................................... B32B 35/00
[52] U.S. Cl. ........................... 156/584; 156/344; 414/935; 414/937; 438/464
[58] Field of Search ..................................... 156/344, 584; 437/226; 414/935, 937; 29/426.3, 426.5, 426.6

[56] References Cited

U.S. PATENT DOCUMENTS

| | | | |
|---|---|---|---|
| 4,584,045 | 4/1986 | Richards | 156/345 |
| 4,638,601 | 1/1987 | Steere et al. | 451/5 |
| 5,478,428 | 12/1995 | Carpenter | 156/344 |

FOREIGN PATENT DOCUMENTS 62-106642  5/1987  Japan ............................. H01L 21/68

Primary Examiner—Mark A. Osele
Attorney, Agent, or Firm—Koda & Androlia

[57] ABSTRACT

A device for conveying a wafer ring between a wafer ring container and a pellet pick-up device. A pair of guide rails which guide both side edges of a wafer ring that is conveyed by a wafer ring conveying assembly are installed pivotally in a vertical direction near the wafer ring cassette. The guide rails are pivoted so as to take a horizontal position when the conveying of the wafer ring is performed and take a vertical position when the pellet pick-up device is in operation. Thus, the operation of the pellet pick-up device is not hindered by the guide rails.

2 Claims, 5 Drawing Sheets

WAFER RING SUPPLY AND RETURN DEVICE

BACKGROUND OF THE INVENTION

1. Field of the Invention

The present invention relates to a wafer ring supply and return device.

2. Prior Art

Japanese Patent Application Laid-Open (Kokai) No. 62-106642 discloses one example of a conventional wafer ring supply and return device.

This device includes: a wafer ring cassette that accommodates wafer rings at a predetermined pitch, an elevator device which raises and lowers the wafer ring cassette, a wafer ring conveying means which conveys wafer rings one at a time from the wafer ring cassette and transfers the wafer rings onto a pellet pick-up device and then returns used wafer rings from which the semiconductor pellets have been removed to empty wafer ring accommodating sections of the wafer ring cassette, and a pair of guide rails which guide both side edges of the wafer rings conveyed by the wafer ring conveying means.

The wafer rings used in this device include wafer sheets which are attached at their circumferential areas to the wafer rings, and semiconductor pellets arranged in the X and Y directions on the wafer sheets and pasted thereto.

The pellet pick-up device includes a wafer ring supporting ring to which wafer rings are placed thereon, and this wafer ring supporting ring is moved in the X and Y directions by an XY table in order to position the semiconductor pellets mounted on the wafer sheet in the pick-up position. However, in the prior art described above, a pair of guide rails which are used to guide the wafer rings are installed between the wafer ring cassette and the pellet pick-up device. Accordingly, the pellet pick-up device must be driven on a path that is separated from the guide rails so that the operation of the pellet pick-up device is not hindered by the guide rails. This arrangement, however, results an in increase of the overall size of the wafer ring supply and return device.

SUMMARY OF THE INVENTION

Accordingly, the object of the present invention is to provide a wafer ring supply and return device which makes it possible to reduce the size of the device.

The object of the present invention is accomplished by a unique structure for a wafer ring supply and return device which comprises:

- a wafer ring cassette in which wafer rings with adhesively attached wafer sheets to which pellets are pasted are held,
- an elevator device which raises and lowers the wafer ring cassette,
- a wafer ring conveying means which conveys wafer rings one at a time from the wafer ring cassette to a pellet pick-up device and then returns depleted wafer rings from which semiconductor pellets have been removed to the wafer ring cassette, and
- a pair of guide rails which guide both side edges of the wafer rings conveyed by the wafer ring conveying means, and the unique structure of the present invention is that
- the guide rails are installed in a pivotal fashion in a vertical direction about a rotating shaft located on the side of the wafer ring cassette, and
- during the conveying of wafer rings, the guide rails are caused to pivot so that the conveying surfaces of the guide rails are set horizontally.

DETAILED DESCRIPTION OF THE PREFERRED EMBODIMENTS

Figure 1:
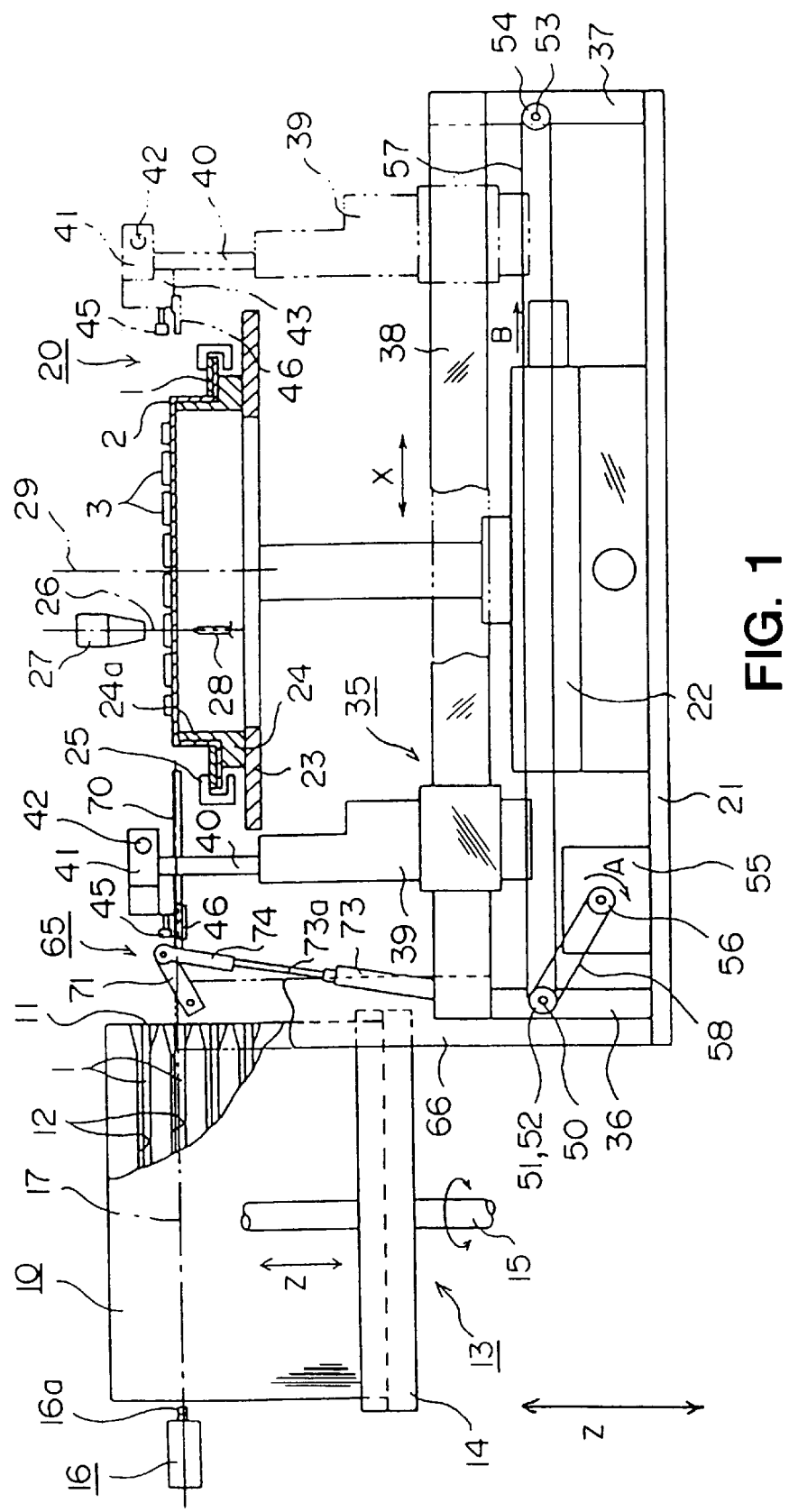
FIG. 1 is a partially sectional front view which illustrates one embodiment of the wafer ring supply and return device of the present invention.

A preferred embodiment of the present invention will be described with reference to FIGS. 1 through 5.

In essence, according to the preferred embodiment of the present invention, a wafer ring guide means 65 which has guide rails 69 and 70 that guide wafer rings 1 when the wafer rings 1 are conveyed from a wafer ring cassette 10, which is raised and lowered by means of an elevator device 13, to a pellet pick-up device 20 or from the pellet pick-up device 20 to the wafer ring cassette 10, while being held by the upper and lower claws 45 and 46 of a wafer ring conveying means 35, is provided between the wafer ring cassette 10 and pellet pick-up device 20. The wafer ring guide means 65 includes a frame 66 which is installed on the wafer ring cassette 10, and a rotary shaft 67 is supported on the upper portion of this frame 66. The guide rails 69 and 70 are attached to the rotating shaft 67 which is caused to pivot by an air cylinder 73, so that the guide rails 69 and 70 assumes two different positions when pivoted.

Figure 2:
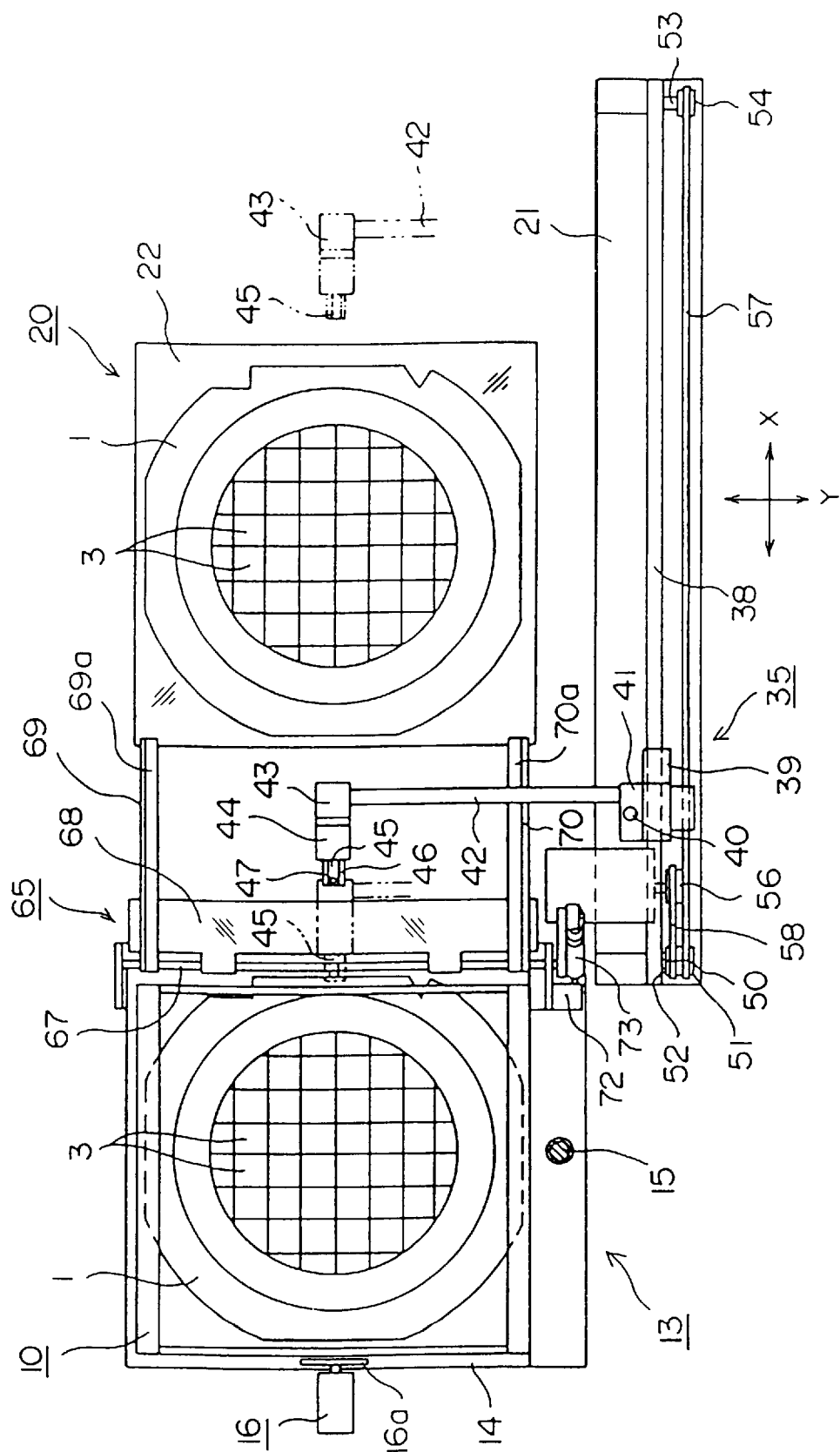
FIG. 2 is a top view thereof.

First of all, as shown in FIGS. 1 and 2, each one of the wafer rings 1 that is handled by the device of the preferred embodiment of the present invention includes a wafer sheet 2. In other words, the outer circumferential portions of wafer sheet 2 is attached to the wafer ring 1, and a plurality of semiconductor pellets 3 are arranged in the X and Y directions and pasted on this wafer sheet 2.

The device of the preferred embodiment includes:
- a wafer ring cassette 10 which accommodates the wafer rings 1,
- an elevator device 13 which raises and lowers the wafer ring cassette 10,
- a pusher means 16 which pushes wafer rings 1 out of the wafer ring cassette 10,
- a pellet pick-up device which is installed at a fixed distance from the wafer ring cassette 10 so as to be located adjacent to the accommodating openings 11 of the wafer ring cassette 10,
- a wafer ring conveying means 35 which conveys pellet containing wafer rings 1 to the pellet pick-up device 20 and then returns used wafer rings 1, from which the semiconductor pellets 3 have been removed, to empty wafer ring accommodating sections 12 formed in the wafer ring cassette 10, and a wafer ring guide means 65 which guides the wafer rings 1 when the wafer rings 1 are being conveyed by the wafer ring conveying means 35.

The structures of these elements will be described below in detail.

The structures of the wafer ring cassette 10, elevator device 13 and pusher means 16 will be described first. These elements (the wafer ring cassette 10, elevator device 13 and pusher means 16) have conventional universally known structures and will be described briefly.

The wafer ring cassette 10 has a plurality of wafer ring accommodating sections 12 which are positioned at a prescribed pitch in the vertical direction (or Z direction), and a wafer ring 1 is accommodated in each of these wafer ring accommodating sections 12.

The elevator device 13 has an elevator 14, and the wafer ring cassette 10 is provided on this elevator 14. The elevator 14 is screw-engaged with a screw shaft 15 which is rotated by a motor (not shown). When the motor is actuated, the elevator 14 is moved upward and downward.

The pusher means 16 is an air cylinder and is positioned at the wafer ring conveying level 17 in the Z direction. The pusher means 16 pushes the wafer rings 1 out of the wafer ring cassette 10 by the operating rod 16a of the air cylinder.

Next, the pellet pick-up device 20 will be described. This device also has a conventionally known structure, and the description thereof will be brief An XY table 22 which is driven in the X and Y directions is installed on a base plate 21, and a supporting plate 23 is provided above this XY table 22. The supporting plate 23 is movable in a vertical direction. A wafer ring supporting ring 24 which has an annular cylindrical wall 24a is installed on the supporting plate 23. The annular cylindrical wall 24a is smaller in size than the wafer rings 1.

A chuck ring 25 which is driven upward and downward (i.e., in the Z direction) by a vertical driving means (not shown) is installed above the wafer ring supporting ring 24.

A suction chucking nozzle 27, which is moved in the Z direction and in the X and Y directions by a vertical driving means (not shown) and XY table 22, is installed above the pick-up position 26. A needle 28 which is moved in the Z direction by a vertical driving means (not shown) is installed beneath the pick-up position 26.

Next, the structure of the wafer ring conveying means 35 will be described.

Supporting plates 36 and 37 are provided on both ends of the base plate 21, and a guide rail 38 which extends in the X direction is secured to the upper end portions of the supporting plates 36 and 37. A slider 39 is fitted over the guide rail 38 so that the slider 39 slides on this guide rail 38, and a supporting rod 40 which extends upward is provided on the slider 39 in vertically movable fashion. A supporting block 41 is mounted on the upper end portion of the supporting rod 40, and a supporting rod 42 which extends in the Y direction is fastened to the upper end portion of the supporting block 41.

Figure 3A:
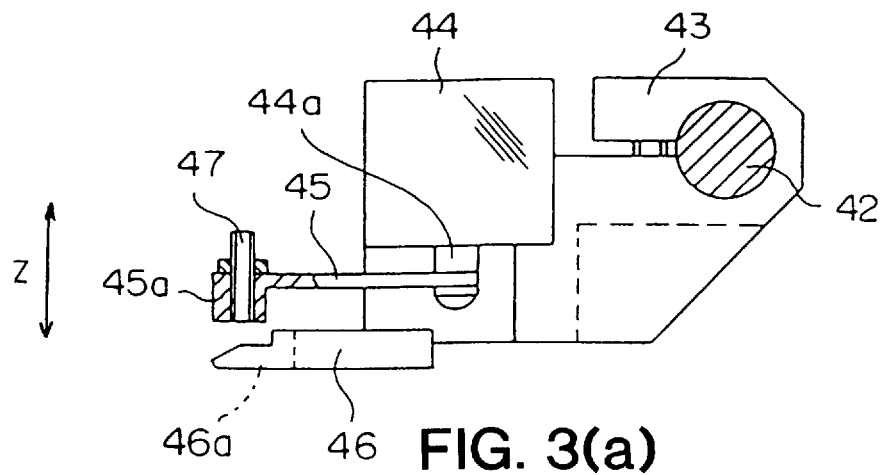
FIG. 3 illustrates the upper and lower claws that hold the wafer rings, in which FIG. 3(*a*) is a partially sectional front view, and FIG. 3(*b*) is a bottom view.
Figure 3B:
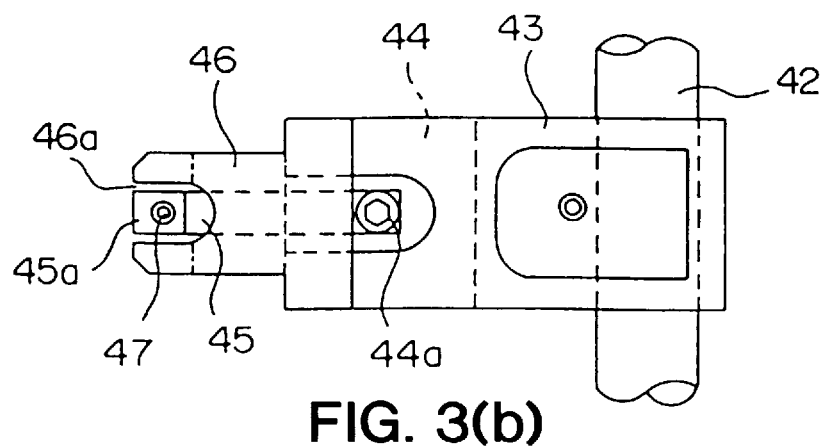

A claw holder 43 is provided on the tip end portion of the supporting rod 41, and an air cylinder 44 is mounted on this claw holder 43 as shown in FIG. 3. An upper claw 45 is coupled to the operating rod 44a of the air cylinder 44, and a lower claw 46 is fastened to the claw holder 43 so as to face the undersurface of the upper claw 45. Thus, when the air cylinder 44 is actuated and the supporting rod 41 is moved out of the air cylinder 44, the upper claw 45 is moved downward in FIG. 3(a) and comes into contact and engages with the lower claw 46 so as to hold an object in between.

A optical sensor 47 is attached to the holding section 45a of the upper claw 45. A groove 46a is formed in one section of the lower claw 46 that faces the holding section 45a. The optical sensor 47 can be mounted on the lower claw 46.

As seen from FIG. 1, a pulley shaft 50 is rotatably provided on the supporting plate 36 so as to be located beneath the guide rail 38, and two pulleys 51 and 52 are coupled to both ends of this pulley shaft 50. Another pulley shaft 53 is rotatably provided on the supporting plate 37 so as to be parallel to the pulley shaft 50, and a pulley 54 is coupled to this pulley shaft 53 so that the pulley 54 faces the pulley 51. A motor 55 is mounted on the base plate 21, and a pulley 56 is coupled to the output shaft of the motor 55. An endless belt 57 is provided on the pulleys 51, 54 and 56, and the slider 39 is connected to the upper portion of the endless belt 57. A drive belt 58 is mounted on the pulleys 52 and 56. Thus, when the motor 55 is actuated, the endless belt 57 is rotated, and therefore, the slider 39 connected to the endless belt 57 is moved by this belt 57.

The structure of the wafer ring guide means 65 will be described with reference to FIGS. 1 through 5, especially to FIGS. 4 and 5.

A vertical frame 66 is installed on the wafer ring cassette 10 so as to face the pellet pick-up device 20. A rotary shaft 67 which extends in the Y direction at a point slightly lower than the wafer ring conveying level 17 is rotatably supported on the upper end portion of the frame 66, and a guide rail supporting plate 68 is fastened to this rotary shaft 67.

A pair of guide rails 69 and 70 which guide both side edges of the wafer rings 1 with their guide grooves 69a and 70a are secured to the (upper) surface 68' of the guide rail supporting plate 68. Here, an arrangement is made so that the guide grooves 69a and 70a of the guide rails 69 and 70 are positioned at the wafer ring conveying level 17 (the surfaces of the guide grooves 69a and 70a are flush with the conveying level 17) when the guide rails 69 and 70 are put into a horizontal position as shown in FIG. 1 and FIG. 4(b).

Figure 5A:
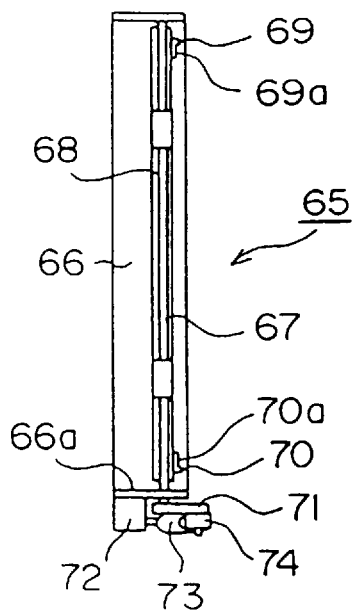
FIG. 5 shows the wafer ring guide means with the guide rails in a vertical state; in which FIG. 5(*a*) is a top view, FIG. 5(*b*) is a front view, and FIG. 5(*c*) is a right-side view.

A crank lever 71 is connected to the end of the rotary shaft 67 that projects over the side plate 66a (see FIG. 5(a)). An air cylinder supporting block 72 is secured to the lower end of the side plate 66a, and an air cylinder 73 is mounted on the air cylinder supporting block 72 so that the air cylinder 73 pivotable. A linking member 74 is coupled to the operating rod 73a of the air cylinder 73, and the linking member 74 is rotatably linked to the crank lever 71.

Next, the operation of the above embodiment will be described.

When the screw shaft 15 of the elevator device 13 rotates, the elevator 14 and wafer ring cassette 10 are moved upward and downward; and a corresponding wafer ring accommodating section 12 of the wafer ring cassette 10 is positioned at the wafer ring conveying level 17. At this point, the guide rails 69 and 70 of the wafer ring conveying means 65 are in the horizontal position.

With the upper claw 45 provided on the claw holder 43 opened (the upper and lower claws 45 and 46 being separated), the slider 39 of the wafer ring conveying means 35 is positioned near the wafer ring cassette 10 (at the left end of the guide rail 38 in FIG. 1) so that the upper claw 45 is positioned above the wafer ring 1 to be taken out.

Then, the pusher means 16 is actuated so that the operating rod 16a advances (toward the right in FIG. 1), thus pushing the wafer ring 1 out of the wafer ring cassette 10 so that the wafer ring 1 is fed into the space between the upper claw 45 and the lower claw 46. As a result, the groove 46a formed in the lower claw 46 is blocked by the wafer ring 1, and the light from the optical sensor 47 is interrupted, as a result, the optical sensor 47 outputs an "on" signal, which represents the detection of the presence of the wafer ring 1 between the upper and lower claws 45 and 46. Upon this "on" signal, the air cylinder 44 is actuated, and the operating rod 44a of the air cylinder 44 is lowered, thus holding the end portion of the wafer ring 1 between the upper claw 45 and lower claw 46.

Next, the motor 55 is actuated so as to rotate in the forward direction (as indicated by arrow A). As a result, the pulley 56 coupled to the output shaft of the motor 55 causes the endless belt 57 to rotate in the direction indicated by arrow B (i.e., toward the right in FIG. 1) via the driving belt 58, thus causing the slider 39 connected to the belt 57 to move in the same direction B along the guide rail 38. The wafer ring 1 held by the upper and lower claws 45 and 46 which are provided on the slider 39 is conveyed toward the pellet pick-up device 20 while being guided by the pair of guide rails 69 and 70 of the wafer ring conveying means.

When the wafer ring 1 reaches the center position 29 of the wafer ring supporting ring 24 of the pellet pick-up device 20, the rotation of the motor 55 is temporarily stopped.

The air cylinder 44 is actuated so that the operating rod 44a retracts, thus releasing the wafer ring 1 onto the wafer ring supporting ring 24.

Then, the motor 55 is again actuated so as to rotate in the forward direction, so that the upper claw 45 and lower claw 46 are moved to the right of the wafer ring supporting ring 24 as shown by the two-dot chain line in FIG. 1 due to the lowering movement of the supporting rod 40. Thus, the supply of the wafer ring 1 onto the wafer ring supporting ring 24 is completed.

Figure 4A:
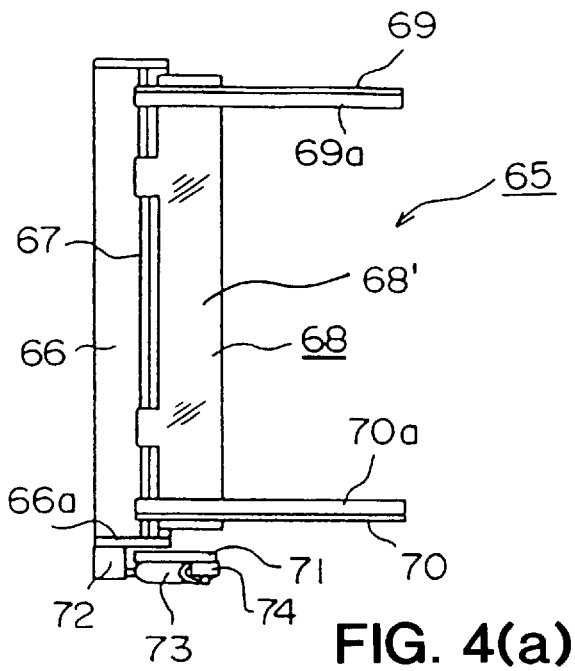
FIG. 4 shows the wafer ring guide means with the guide rails in a horizontal state, in which FIG. 4(*a*) is a top view, FIG. 4(*b*) is a front view, and FIG. 4(*c*) is a right-side view.
Figures 4B, 4C:
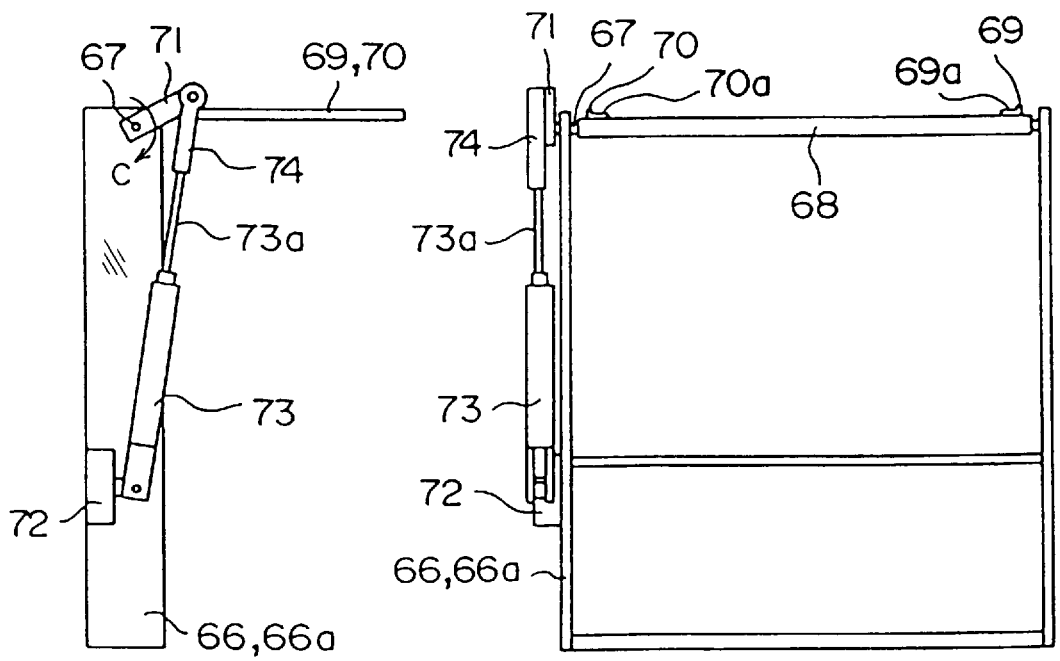
Figures 5B, 5C:
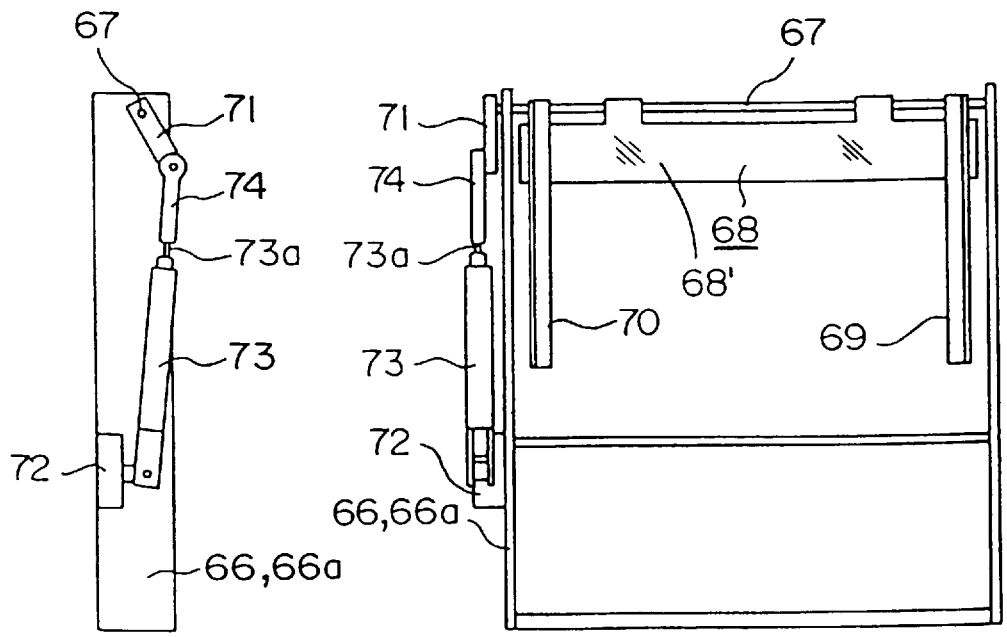

When the wafer ring 1 is placed on the wafer ring supporting ring 24, the air cylinder 73 of the wafer ring guide means 65 is actuated so that the operating rod 73a is retracted As a result, the crank lever 71 and rotary shaft 67 which are connected to the operating rod 73a via the linking member 74 are pivoted in the direction indicated by arrow C in FIG. 4(b), thus causing the pair of guide rails 69 and 70 to assume a vertical position as shown in FIGS. 5(a) through 5(c) from the horizontal position which is shown in FIGS. 4(a) through 4(c).

When the wafer ring 1 is placed on the wafer ring supporting ring 24 as described above, the wafer ring supporting ring 24 is lowered by a driving means (not shown), so that the wafer ring 1 is moved downward. As a result, the wafer sheet 2 is stretched so that gaps between the plurality of semiconductor pellets 3 pasted on the wafer ring 1 are widened. Then, the XY table 22 is driven so that the (first) semiconductor pellet 3 that is to be picked up is positioned in the pick-up position 26. The needle 28 is raised to push the semiconductor pellet 3 upward, and also the suction chucking nozzle 27 is lowered so that the semiconductor pellet 3 positioned in the pick-up position 26 is suction-held and picked up. The suction chucking nozzle 27 which thus holds the semiconductor pellet 23 is raised, moved in the X and Y directions and then lowered, so that the semiconductor pellet 3 is placed in a semiconductor pellet positioning location or bonding position (both not shown). Afterward, the suction chucking nozzle 27 moves back to the pick-up position 26.

When the semiconductor pellet 3 positioned in the pick-up position 26 is thus picked up, the XY table 22 is driven so that the next semiconductor pellet 3 to be picked up is located in the pick-up position 26. The plurality of semiconductor pellets 3 pasted on the wafer sheet 2 are successively picked up by the suction chucking nozzle 17. When all of the semiconductor pellets 3 on the wafer sheet 2 have been picked up, the wafer ring 1 is returned to the wafer ring cassette 10 as a "used wafer ring".

The used wafer rings returning operation will be described below.

The XY table 22 is driven so that the pellet pick-up device 20 is moved to the initial position, which is the position of the pick-up device 20 when a wafer ring 1 is supplied thereon as described above The chuck ring 25 is raised so that the wafer ring 1 is lifted from the wafer ring supporting ring 24.

The air cylinder 73 is actuated in the opposite direction from that described above, so that the operating rod 73a protrudes, thus causing the crank lever 71 and rotary shaft 72 to pivot in the opposite direction from that described above, thus bringing the guide rails 69 and 70 back to assume the horizontal position as shown in FIG. 4.

Then, with the upper claw 45 and lower claw 46 separated, the motor 55 is actuated to rotate in the reverse direction, thus causing the claws 45 and 46 to move toward the left in FIG. 1. As a result, the end portion of the used wafer ring 1 enters in the space between the upper claw 45 and lower claw 46 and is detected by the optical sensor 47. Then, the operating rod 44a of the air cylinder 44 is lowered (or moved out of the cylinder 44) upon this detection, so that the upper claw 45 holds the wafer ring 1 together with the lower claw 46.

Next, the motor 55 is again actuated so that the slider 39 is moved further toward the left in FIG. 1, thus causing the used wafer ring 1 held by the upper and lower claws 45 and 46 to be returned to an empty wafer ring accommodating section 12 of the wafer ring cassette 10 while being guided by the guide rails 69 and 70.

Afterward, the air cylinder 44 is actuated so that the operating rod 44a is retracted, causing the upper claw 45 to be moved upward and the used wafer ring 1 to be released from the upper and lower claws 45 and 46. The used wafer ring 1 is thus accommodated in the wafer ring accommodating section 12.

When the supply and return of one wafer ring is thus completed, the wafer ring cassette 10 is lowered by one pitch by the elevator 14 of the elevator device 13, so that the next unused wafer ring 1 that is to be supplied to the pellet pick-up device 20 is positioned at the wafer ring conveying level 17.

The supply and return of the all of the wafer rings 1 is executed by repeating the series of the above described operations.

As seen from the above, in this preferred embodiment of the present invention, the guide rails 69 and 70 are positioned horizontally only when the supply and return operations of a wafer ring 1 is executed. When the semiconductor pellet pick-up operation in the pellet pick-up device 20 is being executed, the guide rails 69 and 70 takes a vertical position so that the space between the wafer ring cassette 10 and pellet pick-up device 20 is opened wide and not occupied by the guide rails 69 and 70. Accordingly, the pellet pick-up device 20 can be moved in the X and Y directions at positions near the wafer ring cassette 10 without being hindered by the guide rails 69 and 70. Thus, the size of the wafer ring supply and return device can be reduced.

According to the present invention, a pair of guide rails which guide both side edges of wafer rings that are conveyed by a wafer ring conveying means are installed so as to pivot in a vertical direction about a rotary shaft provided adjacent to the wafer ring cassette. The guide rails are caused to pivot so that the conveying surfaces of the guide rails are horizontal while the wafer rings are being conveyed and vertical when the wafer ring is not being conveyed. Accordingly, the overall size of the device can be minimized.

We claim:

1. A wafer ring supply and return device in a semiconductor processing apparatus, said device comprising:

a wafer ring cassette in which wafer rings having wafer sheets with semiconductor pellets adhesively mounted thereon are held, an elevator device which raises and lowers said wafer ring cassette, a wafer ring conveying means which conveys said wafer rings one at a time from said wafer ring cassette to a pellet pick-up device and then returns depleted wafer rings from which said semiconductor pellets have been removed to said wafer ring cassette, a pair of guide rails which guide both side edges of said wafer rings conveyed by said wafer ring conveying means, said pair of guide rails being pivotable between a vertical and horizontal positions about a rotary shaft provided adjacent to said wafer ring cassette, and an actuating means for causing said pair of guide rails to pivot from said vertical position to said horizontal position so that said pair of guide rails are positioned horizontally when said wafer rings are being conveyed.

2. A wafer ring supply and return device according to claim 1, wherein one end of each of said guide rails which is located adjacent to said wafer ring cassette when said guide rails are positioned horizontally is fastened to said rotary shaft which is provided on a frame and is rotated by a rotary driving means.

* * * * *